(12) United States Patent  
Worley

(10) Patent No.: US 7,231,582 B2  
(45) Date of Patent: Jun. 12, 2007

(54) METHOD AND SYSTEM TO ENCODE AND DECODE WIDE DATA WORDS

(75) Inventor: James Leon Worley, Denton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 517 days.

(21) Appl. No.: 10/742,595

(22) Filed: Dec. 19, 2003

(65) Prior Publication Data

US 2005/0138537 A1 Jun. 23, 2005

(51) Int. Cl.
*G06F 11/10* (2006.01)
*G06F 11/20* (2006.01)
*G11C 29/00* (2006.01)

(52) U.S. Cl. .................... 714/773; 714/801; 714/805

(58) Field of Classification Search ............... 714/711, 714/763, 773, 801, 805
See application file for complete search history.

(56) References Cited

U.S. PATENT DOCUMENTS

| 4,049,974 | A | * | 9/1977 | Boone et al. .................. 326/95 |
| 4,183,463 | A | * | 1/1980 | Kemmetmueller .......... 714/804 |
| 4,451,922 | A | * | 5/1984 | Dearden et al. ............ 714/801 |
| 4,646,306 | A | * | 2/1987 | Davis et al. ................. 714/801 |
| 4,747,080 | A | * | 5/1988 | Yamada ....................... 365/200 |
| 4,785,452 | A | * | 11/1988 | Petz et al. .................... 714/756 |
| 5,191,243 | A | * | 3/1993 | Shen et al. ..................... 326/37 |
| 5,434,871 | A | * | 7/1995 | Purdham et al. ............ 714/805 |
| 5,490,156 | A | * | 2/1996 | Byrne ......................... 714/801 |
| 5,517,514 | A | * | 5/1996 | Norrie et al. ................ 714/800 |
| 5,608,741 | A | * | 3/1997 | Kumar et al. ............... 714/800 |
| 5,659,678 | A | * | 8/1997 | Aichelmann et al. ......... 714/25 |
| 5,668,577 | A | * | 9/1997 | Sutter ......................... 345/563 |
| 5,784,383 | A | * | 7/1998 | Meaney ...................... 714/732 |
| 6,851,086 | B2 | * | 2/2005 | Szymanski .................. 714/781 |

* cited by examiner

*Primary Examiner*—Stephen M. Baker
(74) *Attorney, Agent, or Firm*—Lisa K. Jorgenson; Bryan A. Santarelli

(57) ABSTRACT

A parity generation circuit includes a plurality of bit-generation circuits. Each bit-generation circuit receives respective data bits and a respective hard latch signal, and operates to generate a parity signal indicating the parity of the corresponding data bits when the hard latch signal is inactive. Each bit-generation circuit drives the parity signal to a set value when the hard latch signal is active. An output circuit is coupled to the bit-generation circuits to receive the parity signals and operates to generate an output parity signal in response to the parity signals from the bit-generation circuits.

25 Claims, 7 Drawing Sheets

METHOD AND SYSTEM TO ENCODE AND DECODE WIDE DATA WORDS

TECHNICAL FIELD

Error detection and correction codes are codes utilized in a wide variety of digital electronic systems to detect and correct errors in stored and communicated data. Using such codes, the value of one or several erroneous bits can be restored to a correct value or values after a storage or a transmission.

BACKGROUND

FIG. 1 is a block diagram of a typical memory system 10 including memory 8 for storing data, where the term data includes any type of stored information including program instructions and data generated by or associated with such instructions. When the memory system 10 stores a data word 2, the data word is first presented to error correcting code (ECC) logic 4 before being written into the memory 8. The ECC logic 4 generates error checking and correction bits using the data word 2, and these additional error bits are then stored in memory 8 along with the data word 2. In the following description, the error detection and correction bits may be referred to as check bits, and the original data word 2 in combination with the check bits may collectively be referred to as a code word. The data word 2 and check bits are stored in specific locations in the memory 8 as programmed by redundancy logic 6 which redirects data to redundant storage locations in the memory to thereby replace defective storage locations, as will be described in more detail below. In this way, the redundancy logic 6 replaces defective storage locations to which data was initially directed with redundant storage locations, as will be understood by those skilled in the art. When data is subsequently read from the memory 8, the data is again presented to the ECC logic 4 to ensure the data as read is the same as the data word 2 initially stored in the memory.

The memory 8 is designed to maximize the number of bits available (storage capacity) without sacrificing too much memory speed (the time it takes to store or access the data). Thus, memory cells that store individual bits are packed as closely together as possible through a variety of different techniques, such as by reducing the number of transistors per memory cell and by making the transistors smaller. Typically, the smaller a memory cell the longer it takes to access the cell due to the small voltages and currents that must be properly sensed. Thus, there is a trade off in using more and larger transistors to increase the speed of the memory 8 but at the same time reducing the storage capacity of the memory. As a result, the memory system 10 typically includes a combination of relatively slow but high-capacity memory cells such as dynamic random access memory (DRAM) cells, and also includes lower-capacity but faster memory cells such as static random access memory (SRAM) cells.

An array of memory cells (not shown) includes a plurality of rows and columns of memory cells, with an address being associated with each memory cell in the array. In high-capacity arrays such as those formed from DRAM cells, the address is typically divided into a column address and a row address. The row address is typically sent first, and in response to the row address the data stored in an entire row of memory cells in the array is sensed and stored in circuitry in the memory 8. The column address is provided to the memory 8 after the row address, and selected ones of the memory cells in the addressed row are selected in response to the column address. If data is being fetched from a series of consecutive column addresses within the same addressed row of memory cells, the data stored in these consecutive columns of memory cells can be accessed from the circuitry that previously sensed and stored the data of the addressed row.

The memory 8 is typically manufactured with spare or redundant bits, and the redundancy logic 6 is programmed to substitute any defective memory cells with redundant memory cells. The redundancy logic 6 is typically programmed during initial testing of the memory 8. Referring to FIG. 2, the memory 8 of FIG. 1 is includes a memory array 12 of rows and columns of memory cells (not shown). The main approaches to the substitution of defective memory cells in the array 12 with redundant cells utilize laser blown fuses, electrical fuses, or one-time-programmable MOSFETs. Laser fuse based repair is still a common approach, although this type of repair increases test costs substantially since a 3-step test process of test, laser repair, and retest is required. Electrical fuse based repair can be performed as a single process using a tester which tests, electrically repairs, and retests while the memory 8 is coupled to the tester.

The repair process for substituting redundant memory cells for defective memory cells typically consists of identifying the proper laser programmable fuses, electrically programmable fuses, or one-time-programmable MOSFETs needed to deactivate a defective column 14 of memory cells, deactivating the defective column or group of columns containing a defective cell or cells), activating a redundant column 16 or group of redundant columns of memory cells, and configuring the redundancy logic 6 to assign the array address corresponding to the defective column 14 to the address of a redundant column 16. After the defective column 14 is disabled and the redundancy logic 6 programmed, whenever the defective column 14 is addressed the redundant column 16 will be accessed instead, allowing data to be read from and written to the memory cells in the redundant column 16. In this way, every time a subsequent read or write operation addresses the defective column 14, the redundant column 18 is accessed instead of the defective column. The circuitry, operation, and processes for redundancy programming to replace defective memory cells with redundant cells is well understood by those skilled in the art, and thus will not be described in more detail.

Modern computer systems typically contain hundreds of megabytes (MB) of memory for storing programming instructions and associated data. With so much memory now being contained in computer systems, the likelihood of defective memory cells has increased. For example, 128 MB of DRAM is a typical amount contained in present personal computer systems. Each byte of memory typically includes 8 bits and thus is stored in 8 individual memory cells. Accordingly, there are over $1 \times 10^9$ DRAM memory cells required to store the desired 128 MB of data. Moreover, these DRAM memory cells are typically accessed hundreds of millions of times per second. Given such a large number of memory cells and the frequency with which the cells are accessed, the probability that an error will occur in data being read from or written to the memory cells is fairly high.

As previously mentioned, the ECC logic 4 adds error bits to the stored data word 2, with the error bits being redundant information that allows errors in the data stored in the memory 8 to be detected and in some cases corrected. Referring again to FIG. 1, the ECC logic 4 performs error-correcting operations on data words 2 used by application programs (not shown) accessing the memory 8. In general, referring to FIG. 3 a typical embodiment of the ECC logic 4 is shown in more detail to describe the conventional way errors are detected and corrected. A data input signal DI, which corresponds to the data word 2 in FIG. 1, is a word M bits long and there are an additional K bits added to the word that are used to detect and correct data bit errors. An encode function 72 applies the algorithm used to generate or properly set the additional K bits based upon the original M bits. After encoding of the data word DI by the encode function 72, a code word formed by the M and K bits is stored in the memory 8. At some subsequent time, the code word or the M and K bits are read from the memory 8, such as by an application program, and the read M bits are presented to a buffer 80 in a corrector unit 78 and are also presented to an encode function 74, which is identical to encode function 72 and generates K bits based on the bit values of the read M bits. The compare unit 76 compares the K bits generated by the encode function 74 to the K bits read from memory 8. If the two sets of K bits have identical values the compare unit 76 signals the corrector unit 78 to provide the M-bits from buffer 80 without change as a data out signal DO. If, however, the compare unit 76 signals the corrector unit 78 that the two sets of K bits have different values, the corrector unit corrects the M bits in the buffer 80 based on a correction algorithm and thereafter provides the corrected M bits from the buffer 80 as the data out signal DO. The compare unit 76 also generates an error signal ES in this case, which is utilized by other circuitry (not shown) in the memory system 10 (FIG. 1).

The ECC logic 4 may execute a variety of different error detection and correction algorithms to correct errors detected in the stored code word. One common algorithm is an algorithm that utilizes a code known as a Hamming code, which is an error detection and correction code used in many different types of digital systems. An example of a Hamming code and the application of this code by the ECC logic 4 will now be described in more detail. Referring to FIG. 1, typical data words 2 are 8 to 64 bits wide and the ECC logic 4 typically applies a single-error-correction-double-error-detection (SECDED) algorithm to the data words, with this algorithm being implemented through a Hamming code. A Hamming code has what is known as a Hamming distance between sets of code words that collectively make up the Hamming code, where a code word is a data value combined with the error check bits generated by the algorithm. For example, in FIG. 3 each code word corresponds to M data bits and K error check bits stored in the memory 8 as a code word. The Hamming distance between code words is the number of bits by which the code words differ and determines the number erroneous bits that can be detected and corrected in a code word, as will be understood by those skilled in the art. Take for example the Hamming code made up by the two code words 0001 and 1000. These code words differ in two bits and thus have a Hamming distance of two. With a Hamming distance of two, any single bit error in a code word can be detected. If a single bit in either of these two code words 0001, 1000 changes, the resulting code word is different than either of these two words. This allows a single bit error to be detected since changing any single bit in one of the code words produces a code that is not one of the original two codes words. If two bits are changed in either of these code words, however, these errors may go undetected because if the right two bits change state then the one code word becomes the other. For example, if in the code word 0001 the first and last bits change logic state, meaning that the rightmost 1 bit becomes a 0 and the leftmost bit becomes a 1, then the code word 0001 becomes 1000, which is the other code word. Thus, two erroneous cannot be detected in all situations using this Hamming code having a distance of two.

If the Hamming distance for a code formed by a set of code words is at least 3, we can correct any single bit error in any of the code words. With such a Hamming code, a single bit error is just one bit away from a valid code word, and since every other code word is 2 bits away from the erroneous code word, we correct the error and get back to the only valid code word that is just one bit away. Of course, if multiple bits change state in a code word then this process may erroneously result in a single bit being changed to obtain the nearest valid code word even though this code word is not the original coder word. Thus, only single bit errors can be corrected. For a Hamming code with a distance of 3, however, we can detect whether two bits have changed state even though we cannot correct such errors. This kind of Hamming code having a distance of 3 and is called a Single Error Correction, Double Error Detection (SECDED) code.

As an example of a SECDED code, suppose our data in signal DI in FIG. 3 consists of 4 data bits=[1011] and M thus equals 4. This example requires 3 error check or parity bits in positions $2^0=1=P1$, $2^1=2=P2$, and $2^2=4=P4$. The M data bits will be placed into positions 3, 5, 6, and 7 and designated D3, D5, D6, and D7 in a code word of this SECDED code so that each code word has the form [P1 P2 D3 P4 D5 D6 D7]. Each of the parity bits P1, P2, and P4 is set to a 1 or a 0 to ensure that each code word has a distance of at least 3 (i.e., at least 3 bits are different) from the nearest valid code word by ensuring each subset of M data bits used to calculate the parity bit has an even or odd parity. Odd parity means there are an odd number of 1s in the subset of M data bits and the respective parity bit P and even parity means there is an even number of 1s. Even parity is assumed in the present example.

In the example where data bits D equal 1011, inserting the data bits D3, D5, D6, and D7 into a code word produces [P1 P2 1 P4 0 1 1]. Calculation of the parity bits is as follows: P1=(D3, D5, D7)=(1 0 1). The parity in these three bits is even since there are two "1" bits so the parity bit P1 needs to be set to 0 to make the parity across (P1 D3 D5 D7) be even. Thus P1=0. The code word then becomes [0 P2 1 P4 0 1 1]. The next parity bit P2 is determined from the data bits P2=(D3, D6, D7)=(1 1 1), and since the parity in these bits is currently odd the parity bit P2 must be set to "1" so that the parity across (P2 D3 D6 D7) is even. The code word then becomes [0 1 1 P4 0 1 1]. Finally, the parity bit P4=(D5 D6 D7)=(0 1 1) so the parity bit needs to be set to 0 to give even parity across the bits (P4 D5 D6 D7). Thus, P4=0 and the final code word with the parity bits in place is [0 1 1 0 0 1 1]. A variety of different types of circuitry may be used in the ECC logic 4 to generate the parity bits P1, P2, P4, such as cascaded XOR gates as will be understood by those skilled in the art. The code word [0 1 1 0 0 1 1] is the word that is actually stored in the memory 8 in FIGS. 1 and 3, and the code word that is subsequently retrieved from the memory and processed by the encode function 74, compare unit 76, and corrector unit 78 of FIG. 3. In FIG. 3, the K error check bits correspond to the parity bits P1, P2, and P4.

Now suppose that upon retrieval of the code word from the memory 8, the code word has a value [0 1 1 0 0 0 1]. In other words, the bit in position D6 is in error. In this situation, the encode function 74 and compare unit 76 generate a check word (C4 C2 C1) from the retrieved code word where the bits in the check word are set to 1 if the parity check indicates a parity error for the corresponding parity bit. In the present example, parity bit P1=0 and a check of the retrieved bits (D3 D5 D7)=(1 0 1) has even parity so that bit P1 agrees with the retrieved parity so C1=0. A similar process is used to determine the values of bits C2 and C4. In this example these values are P2=1 and the parity check of the retrieved data bits (D3 D6 D7)=(1 0 1) has even parity. The bit P2 thus indicates that the stored data bits (D3 D6 D7) have odd parity which is not true, so an error has been detected and the bit C2 is set to 1. Since the parity check on the bits in the retrieved code word is in disagreement with the parity bit P2, the bit C2 is set to 1 to indicate the detected error. Exactly which bit in the code word is in error has yet to be determined.

Finally, the bit P4=0 and the parity check of the retrieved bits (D5 D6 D7)=(0 0 1) has odd parity indicating that the bit P4 should equal 1. The bit P4=0, however, so once again an error has been detected and the check bit C4 is set to 1 to indicate the disagreement in values. The check word [C4 C2 C1] therefore has a value of [1 1 0] indicating that an error has been detected in position D6 since the check word represents the bit pattern for the decimal number 6. As a result, the bit D6 will be inverted and in this case changed from a 0 to a 1. The key with this type of code is that the binary value of the check bits indicates the erroneous bit in the code word, as will be appreciated by those skilled in the art. The corrector unit 78 then removes the parity bits P1, P2, P4 from the corrected code word and the bits D3, D5, D6, D7 having the values 1011, which is the original data word portion of the original code word stored in memory, is output from the buffer 80. In the following discussion, the process of generating the parity bits P1, P2, P4 may be referred to as encoding data words and the process of generating the check bits C and detecting and correcting erroneous bits may be referred to as decoding data words.

Referring now to FIGS. 2 and 3, the ECC logic 4 typically processes code words having the number of bits or width used by a particular application, which is typically much less than the number of data bits read from the memory array 12 of FIG. 2 when a given row of memory cells (not shown) is accessed. The problem with using Hamming codes on relatively short code words is that a larger percentage of the overall storage capacity of the memory array 12 is required to store the parity bits generated for each code word. For example, an 8-bit data word (M=8) requires 5 parity bits to implement an SECDED code, and thus each 13 bit code word includes 5 parity bits meaning that approximately 38% (5/13×100%) of the storage capacity of the memory array 12 is required merely for storing the parity bits required to implement the code and thus that may not be used for storing data bits. In contrast, a 256-bit data word (M=256) requires only 10 parity bits to implement an SECDED code, meaning that only approximately 4% (10/256×100%) of the capacity of the memory array 12 is utilized for storing parity bits required to implement the code.

Because the percentage of overall storage capacity of the memory array 12 that is required for storing the parity bits decreases as the number of data bits in each code word increases, it is desirable for the ECC logic 4 to operate on data words having a large number of data bits, which will be referred to hereinafter as "wide" data words. When the ECC logic 4 processes wide data words the logic can be embedded "deeper" into the memory system 10, where the term deeper means closer to the memory 12 of FIG. 2. In a given memory array 12, the widest data word corresponds to the data word containing all the bits in an entire row of the array, as will be appreciated by those skilled in the art. A problem with having the ECC logic 4 process wide data words from the array 12, such as the word corresponding to an entire row of memory cells in the array, is that the ECC logic must process all data from the activated row, which may include data from valid columns of memory cells, data from defective columns, and data from redundant columns. There is no way of knowing prior to testing which columns of memory cells in the array 12 are defective and which redundant columns will be mapped to replace these defective columns. Conventional ECC logic 4 must therefore include circuitry to process only valid data from the array 12, which complicates the circuitry required to implement the ECC logic 4 and prevents such conventional logic from efficiently operating on wide data words.

There is a need for performing error correction and detection on wide data words in memory systems and other types of systems containing memory.

SUMMARY

According to one aspect of the present invention, a parity generation circuit includes a plurality of bit-generation circuits. Each bit-generation circuit receives respective data bits and a respective hard latch signal, and operates to generate a parity signal indicating the parity of the corresponding data bits when the hard latch signal is inactive. Each bit-generation circuit drives the parity signal to a set value when the hard latch signal is active. An output circuit is coupled to the bit-generation circuits to receive the parity signals and operates to generate an output parity signal in response to the parity signals from the bit-generation circuits.

BRIEF DESCRIPTION OF THE DRAWINGS

FIG. 2 is a diagram of the error correcting code logic of FIG. 1 showing the conventional way errors are corrected.

DESCRIPTION OF THE INVENTION

Figure 1:
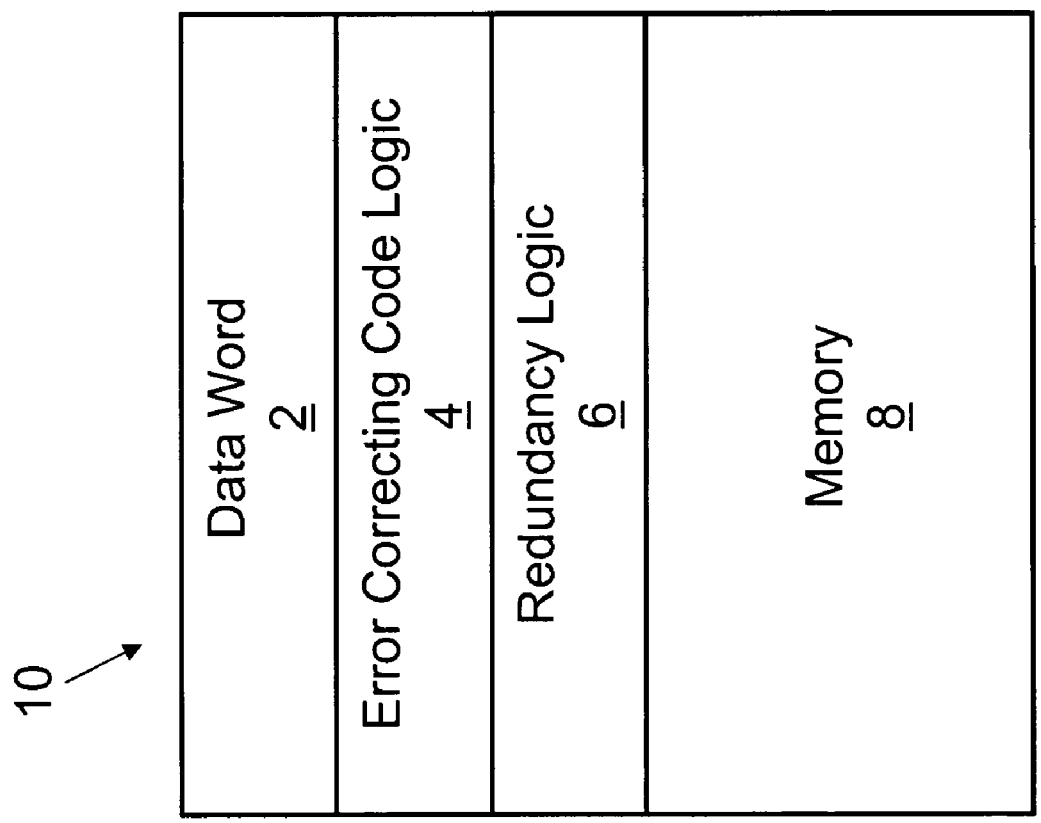
FIG. 1 is a block diagram showing the processing order for ECC and redundancy logic in conventional data I/O operations.
Figure 2:
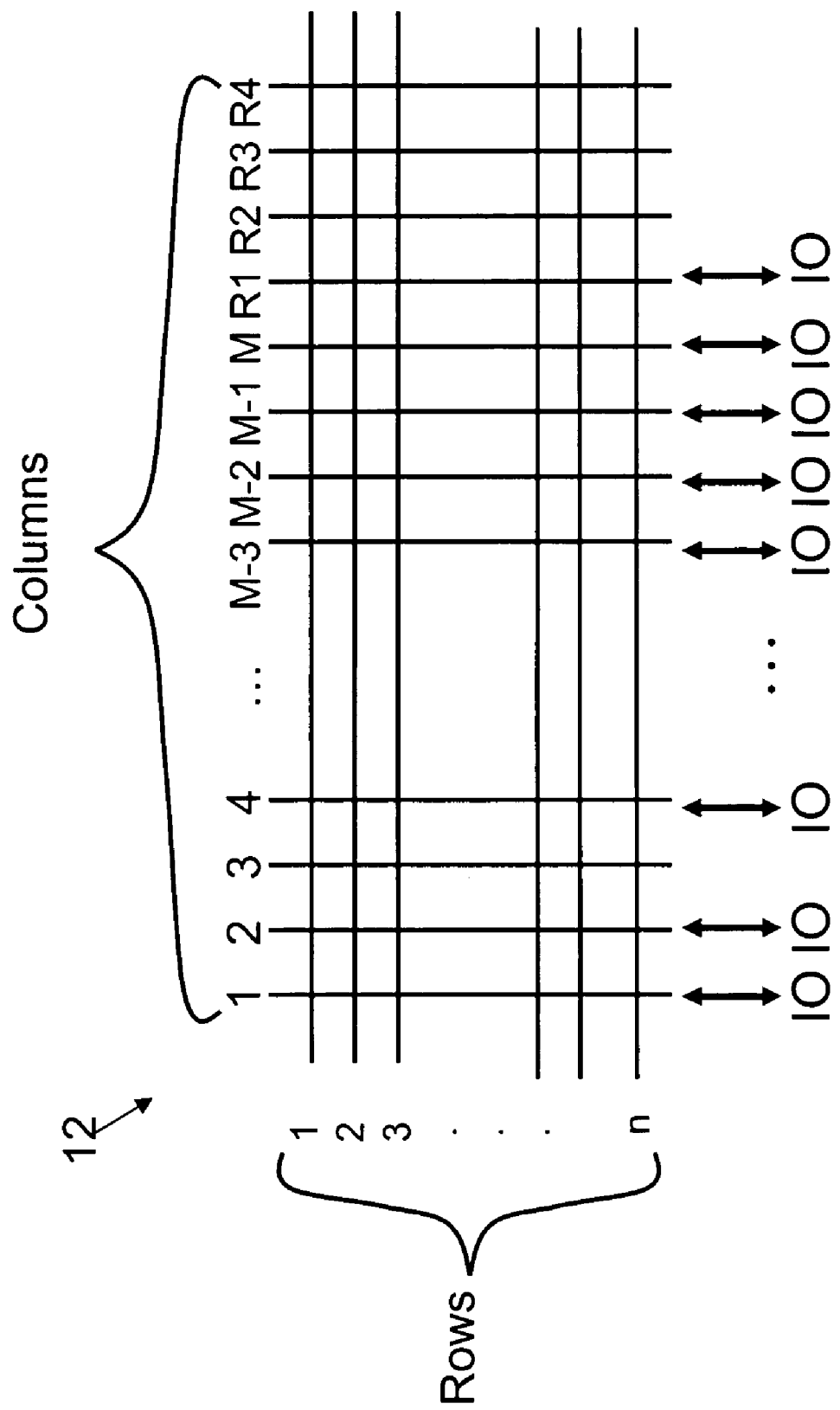
FIG. 2 is a diagram of the memory array of FIG. 1 showing the conventional way redundant columns replace columns with defective bits.
Figure 3:
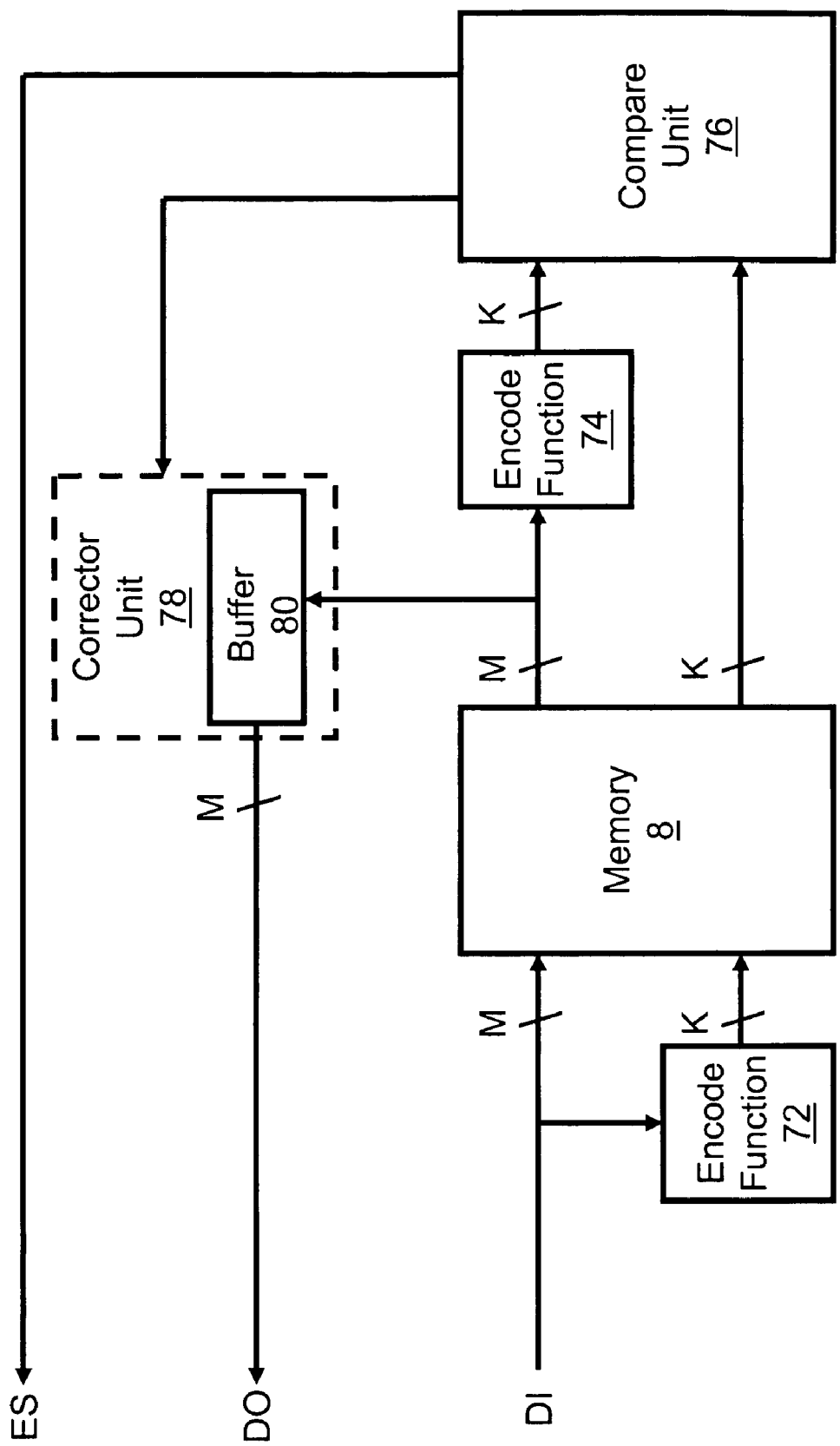
Figure 4:
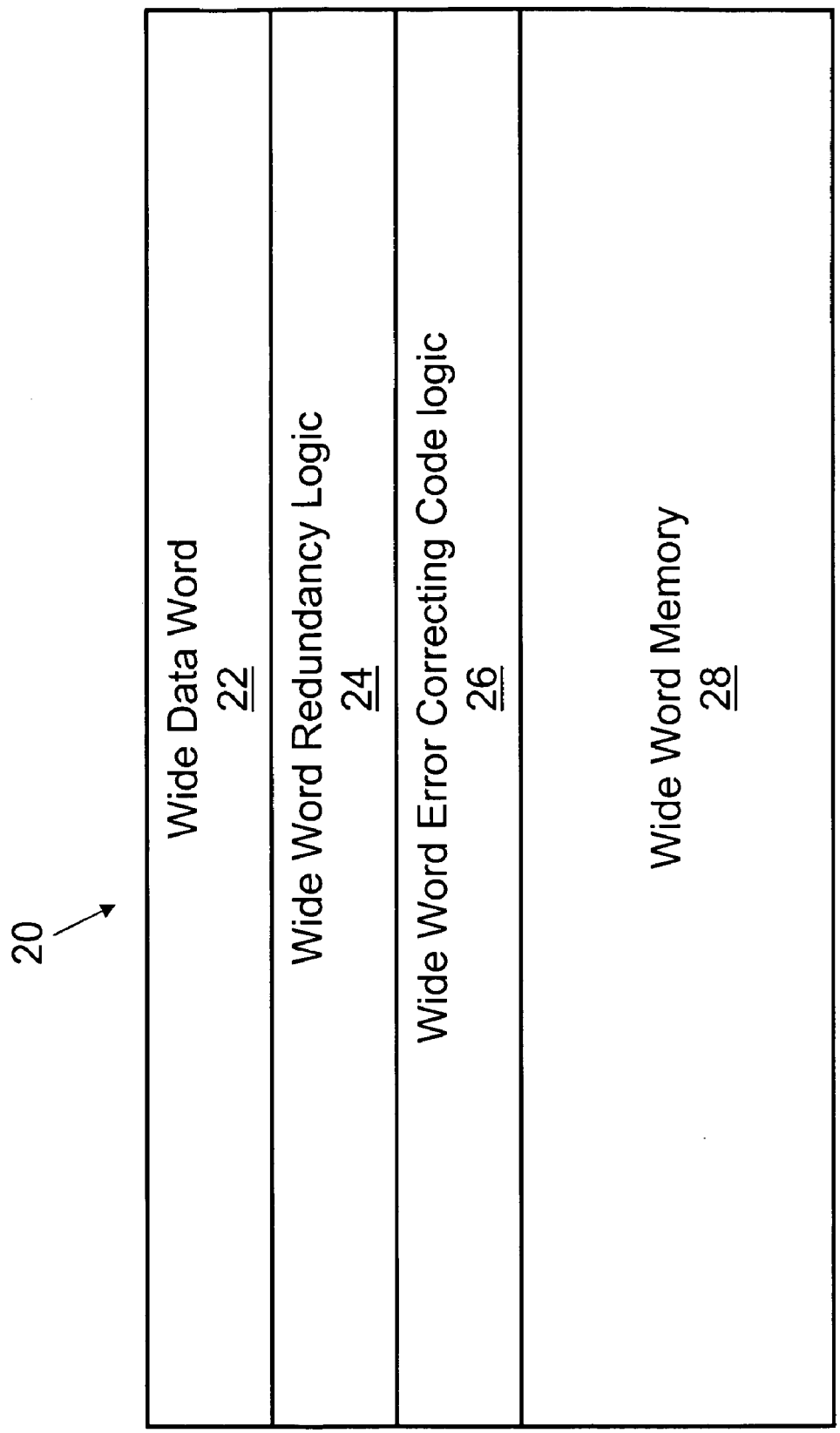
FIG. 4 a block diagram of a memory showing the processing order for redundancy and ECC logic in wide word data I/O operations according to an embodiment of the invention.

FIG. 4 is a functional diagram of a memory system 20 including error correcting code (ECC) logic 26 that operates in combination with redundancy logic 24 to encode and decode wide data words 22 stored in a memory 28. In operation, the redundancy logic 24 is programmed to replace defective memory cells (not shown) in the memory 28 with redundant memory cells, and the redundancy logic thereafter provides signals to the ECC logic 26 that cause the ECC logic to ignore data from defective memory cells in the memory when decoding the wide data words stored in the memory, as will be described in more detail below. The ECC logic 26 is physically formed closer to the memory 28, which allow the ECC logic to operate on wide data words 22 and thereby reduces the percentage of the capacity of the memory that is required for storing parity bits. For example, with the memory system 20 the 32-bit data words that are commonly utilized by many application programs and provided by many memory systems can be concatenated or multiplexed to form a single 256-bit data word prior to storage in the memory 28. This significantly reduces the number of parity bits required to perform error checking and correction on the data words. Eight 32 bit words would, if stored in a conventional manner with the ECC logic 24 implementing an SECDED code, require 7 check bits per data word or approximately 18% (7/39×100%) of the storage capacity of the memory 28. A single 256-bit wide data word, however, requires only 10 check bits and thus only approximately 4% (10/266×100%) of the storage capacity of the memory.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

Figure 5:
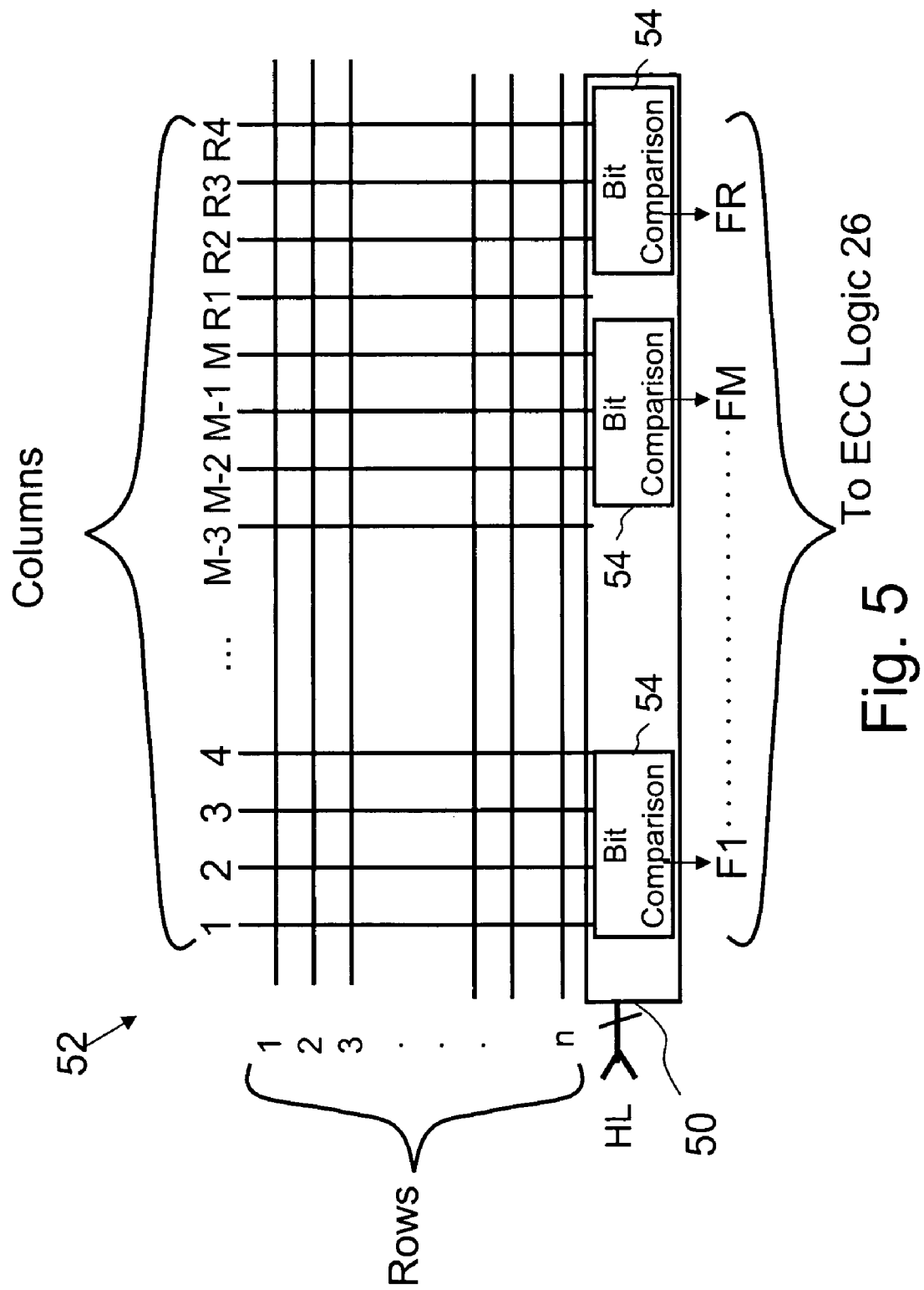
FIG. 5 a functional diagram of a decoding circuit contained in the ECC logic of FIG. 4 according to one embodiment of the present.

FIG. 5 is a functional diagram of a decoding circuit 50 contained in the ECC logic 26 of FIG. 4 according to one embodiment of the present invention. The decoding circuit 50 is coupled to the columns of a memory array 52 including a plurality of memory cells (not shown) arranged in n rows and m columns. Each row of the array 52 includes a number of redundant memory cells which form four redundant columns of memory cells designated R1–R4. The array 52 would normally include additional columns of redundant memory cells although only R1–R4 are shown. The decoding circuit 50 includes a plurality of bit-comparison circuits 54, each bit comparison circuit having inputs coupled to associated columns in the array 52 and having a disable input adapted to receive one of a plurality of hard latch signals HL from the redundancy logic 24. In one embodiment, each of the bit-comparison circuits is formed by exclusive OR (XOR) gates, as will be described in more detail below.

In operation, when the hard latch signal HL applied to a given bit-comparison circuit 54 is inactive, the circuit compares the bits from the corresponding columns and develops an output signal F indicating the parity of the compared bits. For example, in the embodiment of FIG. 5 consecutive columns are grouped into groups of four when a defective column is being replaced. This means that, for example, if the column 3 in the array 52 is defective then columns 1–4 are disabled and replaced with columns R1–R4. This is true even though columns 1, 2 and 4 are not defective in this example. Thus, in the decoding circuit 50 the first bit-comparison circuit 54 generates a signal F1 indicating the parity of the bits on the columns 1–4 of the array 52, the second bit-comparison circuit generates a signal F2 indicating the parity of the bits on the columns 5–8, and so on through the final bit comparison circuit which generates a signal FR indicating the parity of the bits on the redundant columns R1–R4. The signals F1–FR are utilized in generating the parity bits associated with a wide data word 22 being read from the memory 28, as will be explained in more detail below. When the hard latch signal HL applied to a given bit-comparison circuit 54 is active, the circuit drives the output signal F to a logic 0 independent of the values of the bits from the corresponding columns.

In operation, the memory cells in the array 52 are tested and columns containing defective cells are identified. The redundancy logic 24 then maps 4 redundant columns R of memory cells to replace a group of four columns containing at least one defective column. For example, if column 3 is defective then the logic 24 may map the columns R1–R4 to replace columns 1–4, meaning that when an application program attempts to store or retrieve data from a memory address corresponding to any of the columns 1–4, data is written to or read from the memory cells in the redundant columns R1–R4. The redundancy logic 24 also activates and deactivates the appropriate HL signals to enable or disable the appropriate bit-comparison circuits 54. In the previous example, the logic 24 would activate the HL1 signal applied to the first bit-comparison circuit 54 coupled to columns 1–4 and deactivate all other HL signals.

The decoding circuit 50 is coupled to every column of the memory array 52 during manufacture of the memory 28 containing the array, independent of defective cells in the array. This allows the circuit 50 to receive all bits from memory cells in a given row of the array 52 which collectively correspond to a very wide data word. Moreover, the operation of the circuit 50 allows the circuit to be formed from relatively simple circuitry and thereby reduces the space occupied by the circuit. Also, prior to testing of the array 52 the columns of the array that are active, defective, and inactive need be determined, and no fusing circuitry need be supplied to connect the bit-comparison circuits 54 to the active columns. Moreover, with the decoding circuit 50 no problems are presented by data output by inactive or defective columns due to hard latch signal HL from the redundancy logic 24. Such unpredictable values that may be presented, for example, from a defective column does not affect the output signals F generated by the circuit 50 since the HL signals essentially "mask" the data from such defective or inactive columns in the array 52 and thereby prevent the data from affective the values of the signals F. The redundancy logic 24 may dynamically reprogram the decoding circuit 50 via the HL signals on power-up of the memory system 20 in response to a dynamic repair operation tests memory cells in the array 52 upon power-up, maps redundant columns to replace defective columns, and then activates and deactivates the appropriate HL signals. This a built-in-self-test for the memory system 20 that is not possible with conventional memory systems utilizing laser or electrical fusing to configure the array 52 responsive to redundant and defective cells.

Figure 6:
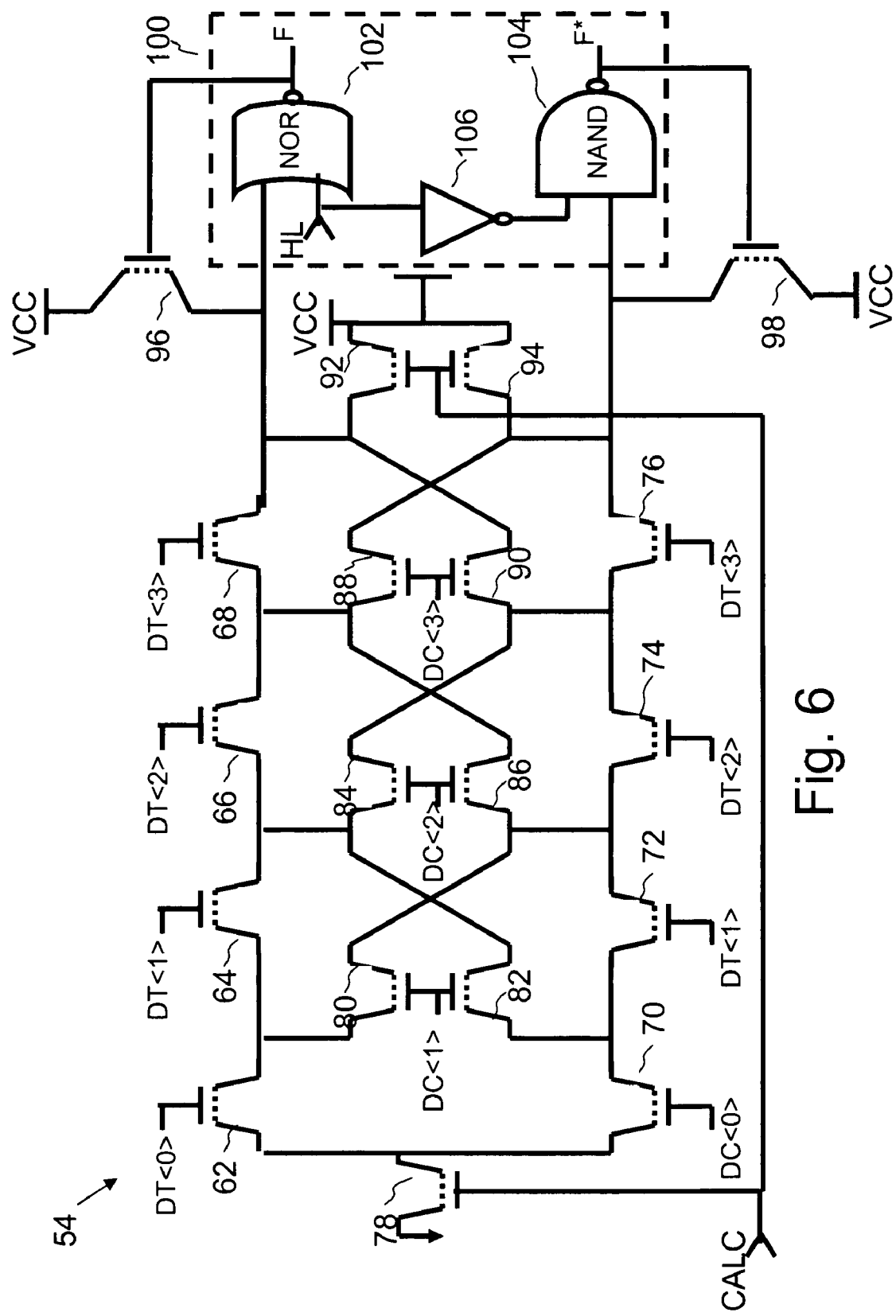
FIG. 6 is a schematic illustrating one of the bit-comparison circuits of FIG. 5 according to one embodiment of the present invention.

FIG. 6 is schematic illustrating one of the bit-comparison circuits 54 of FIG. 5 according to one embodiment of the present invention. The bit-comparison circuit 54 is formed by a plurality of NMOS transistors 62–90 and PMOS transistors 92–98 coupled as shown. More specifically, the NMOS transistors 62–76 and 80–90 receive respective true input signals DT or complementary input signals DC from corresponding columns of the memory array 52 (FIG. 5). Although not shown in FIG. 5, each column in the array 52 includes true and complementary digit lines when array is, for example, an array of DRAM memory cells, as will be understood by those skilled in the art. For each column, a signal on the true digit line represents a bit having a first logic state and a signal on the complementary digit line represents a bit having the complementary logic state. In the example of FIG. 6, the circuit 54 receives the bits DT<0>, DC<0>–DT<3>, DC<3> from the columns 1–4, respectively, of the array 52. A calculation signal CALC generated by the redundancy logic 24 (FIG. 4) is applied to the control the transistors 78, 92, and 94.

The circuit transistors 62-94 operate in combination in response to the DT and DC bits to develop signals on two input nodes IN1 and IN2 of an output circuit 100. The signals on nodes IN1, IN2 indicate the parity of the bits DT, DC, and in response to the signals on these nodes the output circuit generates complementary parity signals F, F* indicating the parity of the bits. More specifically, the output circuit 100 includes an NOR gate 102 having a first input coupled to the node IN1 and a second input that receives the corresponding HL signal. When the HL signal is inactive, the NOR gate 102 is enabled and develops the F signal in response to the signal on the IN1 node indicating the parity of the DT and DC bits.

The output circuit 100 further includes a NAND gate 104 having a first input coupled to the node IN2 and a second input that receives the corresponding HL signal applied through an inverter 106. When the HL signal is inactive, the NAND gate 104 is enabled and develops the F* signal in response to the signal on the IN2 node indicating the parity of the DT and DC bits. When the HL signal is active, the NOR gate 102 is disabled and drives the F signal low and the NAND gate is disabled and drives the F* signal high. If the HL signal is inactive low, when the signal F goes low the transistor 96 turns on and drives the signal on node IN1 high to thereby latch the F signal low. Similarly, if the HL is inactive low, when the signal F* goes low the transistor 98 turns on and drives the signal on node IN2 high to thereby latch the signal F* signal low. The CALC is active high to turn on the transistor 78 during normal operation of the circuit 54. In contrast, when the circuit 54 is inactive the CALC signal is inactive low, turning on the transistors 92, 94 and thereby driving nodes IN1 and IN2 both high. The states of F and F* depend on the state of the HL signal in this situation.

In operation, the CALC signal initially goes inactive low to precharge nodes IN1 and IN2 high through the PMOS transistors 92, 94. The CALC signal thereafter goes active high, turning off the transistors 92, 94 and turning on the transistor 78. When the CALC signal is active high and the HL signal is inactive low, the bit-comparison circuit 54 drives the signals F and F* high and low, respectively, when the parity of the applied DT, DC bits is even, and drives the signals F and F* low and high, respectively, when the parity of the applied DT, DC bits is odd. For example, assume the input bits DT<0>–DT<3> to the circuit 54 are 0101 where DT<0>=0 and DT<3>=1. In this example the parity of the DT bits is even since bits DT<1> and DT<3> are binary 1s. In response to the DT bits and the DC bits (DC<0>–DC<3> are 1010 in this example), the node IN1 is driven low through transistors 68, 86, 72, 70, and 78. The node IN2, which was precharged high, remains high in response to the applied DT and DC bits. Accordingly, the node IN1 is low and node IN2 is high. At this point, the NOR gate 102 receives the low signal on node IN1 and the low HL signal, and drives the F signal high in response to these two low signals. The NAND gate 104 receives the high signal on node IN2 and the high output of the inverter 106 developed in response to the low HL signal, and accordingly drive the F* signal low in response to these two high input signals. The transistor 98 turns on in response to the low F* signal to latch the node IN2 high so there is no concern about charge leaking from this node and the value of F* changing to an erroneous value. From this description and from FIG. 6, one skilled in the art will understand the operation of the circuit 54 for DT bits having odd parity and for various values of the DT bits, and thus, for the sake of brevity, the circuit will not be described in more detail herein.

Notice that when the HL signal is active high, the circuit 54 is disabled and drives the F and F* signals low and high, respectively, independent of the values of the DT and DC bits. In this way, the redundancy logic 24 utilizes the HL signal to cause the circuit 54 to mask the values of defective or inactive columns the array 52 so that these bits do not affect a parity bit being generated by a decoding circuit including the circuits 54. To sum up the operation of the circuit 54, the circuit performs an XOR operation on the applied DT bits and generates the signal F indicating the parity of these bits when the HL signal is inactive low, with the signal F being high for even parity and low for odd parity of the applied DT bits. In contrast, when the signal HL is active high the circuit 54 drives the signals F and F* low and high, respectively. One skilled in the art will appreciate various other circuitry that may be formed to implement this functionality.

Figure 7:
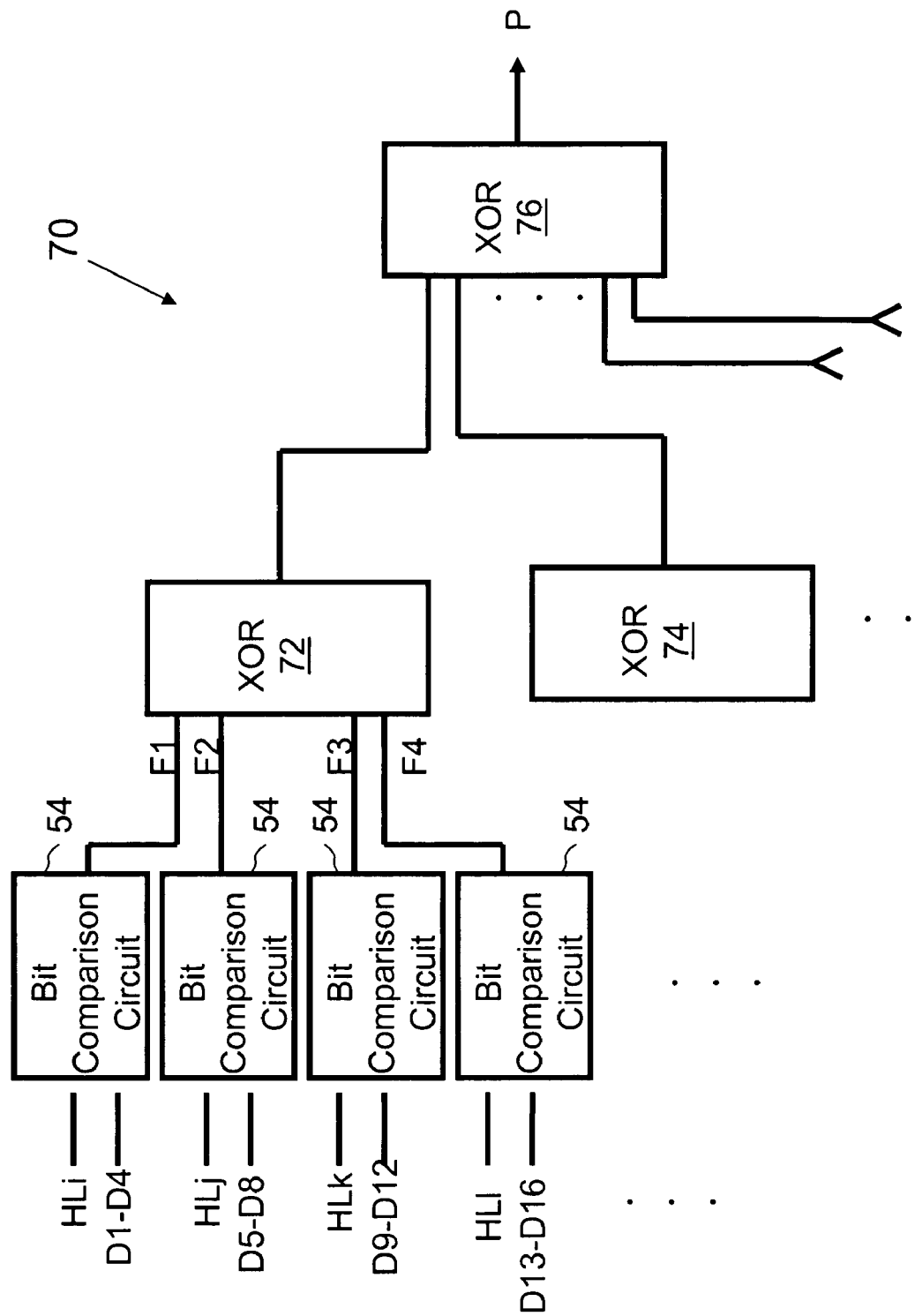
FIG. 7 is a functional block diagram of a parity generation circuit including the bit-comparison circuits of FIG. 6 and contained in the ECC logic of FIG. 4 according to an embodiment of the present invention.

FIG. 7 is a functional block diagram of a parity generation circuit 70 including the bit-comparison circuits 54 of FIG. 6 and contained in the ECC logic 26 of FIG. 4 according to an embodiment of the present invention. The bit-comparison circuits 54 are coupled to the array 52 (not shown) as previously described to receive the bits from the corresponding columns, and each bit-comparison circuit also receives a respective HL signal from the redundancy logic 24. The bit-comparison circuits 54 operate as previously described to generate the signals F which, in turn, are applied to an XOR gate 72 as shown. The XOR gate 72 along with XOR gates 74 and 76 and additional XOR gates not shown are coupled in a tree structure to perform required XOR operations on bits of the wide data word read from the array 52 to thereby develop the required parity bit P. If the bits DT, DC from all active columns are added via the bit-comparison circuits 54 and XOR gates 72–76, the parity bit P indicates the parity of the entire wide data word stored in the array 52. In one embodiment, after the bit-comparison circuits 54 the XOR gates are interconnected to add selected ones of the bits DT, DC to generate a desired parity bit P. In another embodiment of the parity generation circuit 70, the redundancy logic 24 activates selected ones of the HL signals to cause the bit-comparison circuits 54 and XOR gates 72–76 to generate a parity bit P for any subset of columns in the memory array 52. All columns for which the HL signal is active high will, in this embodiment, be excluded from the calculation of the parity bit P.

One embodiment of a Hamming matrix that may be implemented to encode and decode the wide data words 22 using the described embodiments of the decoding circuit 50 and parity generation circuit 70 is described in more detail in U.S. patent application No. XX to Worley entitled H-MATRIX FOR ERROR CORRECTING CIRCUITRY, which was filed concurrently with the present application on Dec. 18, 2003 and which is incorporated herein by reference.

The preceding discussion is presented to enable a person skilled in the art to make and use the invention. Various modifications to the disclosed embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A parity generation circuit, comprising:
a plurality of bit-generation circuits, each bit-generation circuit being adapted to receive respective data bits and being adapted to receive a respective hard latch signal and each bit-generation circuit operable to generate a parity signal indicating the parity of the corresponding data bits when the hard latch signal is inactive, and each bit-generation circuit operable to drive the parity signal to a set value when the hard latch signal is active; and
an output circuit coupled to the bit-generation circuits to receive the parity signals and operable to generate an output parity signal in response to the parity signals from the bit-generation circuits.

2. A parity generation circuit, comprising:
a plurality of bit-generation circuits, each bit-generation circuit being adapted to receive respective data bits and being adapted to receive a respective hard latch signal and each bit-generation circuit operable to generate a parity signal indicating the parity of the corresponding data bits when the hard latch signal is inactive, and each bit-generation circuit operable to drive the parity signal to a set value when the hard latch signal is active; and
an output circuit coupled to the bit-generation circuits to receive the parity signals and operable to generate an output parity signal in response to the parity signals from the bit-generation circuits, wherein the hard latch signals are selectively activated and deactivated to generate an output parity signal indicating a parity of a subset of all data bits applied to the bit-generation circuits.

3. The parity generation circuit of claim 2 wherein each of the bit-generation circuits performs an XOR operation on the applied bits to generate the parity signal when the hard latch signal is inactive.

4. The parity generation circuit of claim 2 wherein the output circuit comprises a plurality of XOR circuits coupled in a cascaded manner with a final one of the XOR circuits developing the output parity signal.

5. The parity generation circuit of claim 2 wherein each bit-generation circuit is adapted to receive four data bits.

6. The parity generation circuit of claim 2 wherein each bit-generation circuit comprises:
a first group of N controllable switches coupled between a first node and a second node, each switch having a control input adapted to receive a respective data bit signal;
a second group of N controllable switches coupled between the first node and a third node, a first switch in the group having a control input adapted to receive a respective complementary data bit signal and the remaining switches having control inputs adapted to receive respective data bit signals;
a controllable switch coupled between a reference voltage source and the first node and having a control input adapted to receive a calculation signal;
a pull-up circuit coupled between a supply voltage source and the second and third nodes and having a control input adapted to receive the calculation signal; and
an output circuit coupled to the second and third nodes and adapted to receive a hard latch signal, the output circuit operable to develop the parity signal responsive to signals on the nodes when the hard latch signal is inactive and operable to drive the parity signal to a set level independent of the signals on the nodes when the hard latch signal is active.

7. The parity generation circuit of claim 6 wherein the output circuit comprises:
an NOR gate having a first input coupled to the second node and a second input adapted to receive the hard latch signal, and an output on which a true parity signal is developed;
an inverter having an input adapted to receive the hard latch signal and having an output; and
a NAND gate having a first input coupled to the third node and a second input coupled to the output of the inverter, and having an output on which a complementary parity signal is developed.

8. A memory, comprising:
a memory array including a plurality of memory cells arranged in rows and columns;
a plurality of first level parity generation circuits, each first level parity generation circuit coupled to a group of columns of memory cells in the memory array to receive data bits from the columns and being adapted to receive a respective hard latch signal, each first level parity generation circuit operable when the corresponding hard latch signal is inactive to develop a corresponding first level parity signal responsive to the data bits from the corresponding group of columns where first level parity signal indicates the parity of the data bits, and each first level parity generation circuit operable when the corresponding hard latch signal is active to drive the corresponding first level parity signal to a set value independent of the corresponding data bits;
a second level parity generation circuit coupled to the first level parity generation circuits to receive the first level parity signals, the second level parity generation circuit operable to develop an output parity signal responsive to the first level parity signals; and
a redundancy logic circuit coupled to the first level parity generation circuits and operable to activate selected ones of the hard latch signals as a function of defective and inactive columns of memory cells in the memory array.

9. The memory of claim 8 wherein the memory array comprises a DRAM array including a plurality of DRAM memory cells arranged in rows and columns.

10. The memory of claim 8 wherein the second level parity generation circuit is operable to generate the output parity signal in response to the first level parity signals from all the first level parity generation circuits.

11. The memory of claim 8 further comprising test circuitry operable to test all memory cells in the memory array and to provide test signals to the redundancy logic indicating the results of these tests, and wherein the redundancy logic is further operable in response to these test signals to map redundant columns of memory cells in the array to replace defective columns and wherein the redundancy logic activates selected ones of the hard latch signals that correspond to groups of columns including at least one defective column and/or inactive groups of columns.

12. The memory of claim 8 wherein the second level parity generation circuit comprises a plurality of XOR circuits coupled in a cascaded manner with a final one of the XOR circuits developing the output parity signal.

13. The memory of claim 8 wherein each of the first level parity generation circuits performs an XOR operation on the applied bits to generate the corresponding first level parity signal when the corresponding hard latch signal is inactive.

14. The memory of claim 8 wherein the redundancy logic selectively activates and deactivates the hard latch signals to generate an output parity signal indicating a parity of a subset of all data bits applied to the first level parity generation circuits.

15. The memory of claim 8 wherein each first level parity generation circuit receives data bits from four columns in the memory array.

16. The memory of claim 8 wherein each first level parity generation circuit comprises:
   a first group of N controllable switches coupled between a first node and a second node, each switch having a control input adapted to receive a respective data bit signal;
   a second group of N controllable switches coupled between the first node and a third node, a first switch in the group having a control input adapted to receive a respective complementary data bit signal and the remaining switches having control inputs adapted to receive respective data bit signals;
   a controllable switch coupled between a reference voltage source and the first node and having a control input adapted to receive a calculation signal;
   a pull-up circuit coupled between a supply voltage source and the second and third nodes and having a control input adapted to receive the calculation signal; and
   an output circuit coupled to the second and third nodes and adapted to receive a hard latch signal, the output circuit operable to develop the parity signal responsive to signals on the nodes when the hard latch signal is inactive and operable to drive the parity signal to a set level independent of the signals on the nodes when the hard latch signal is active.

17. The memory of claim 16 wherein the output circuit comprises:
   an NOR gate having a first input coupled to the second node and a second input adapted to receive the hard latch signal, and an output on which a true parity signal is developed;
   an inverter having an input adapted to receive the hard latch signal and having an output; and
   a NAND gate having a first input coupled to the third node and a second input coupled to the output of the inverter, and having an output on which a complementary parity signal is developed.

18. An electronic system including a memory, the memory comprising:
   a memory array including a plurality of memory cells arranged in rows and columns;
   a plurality of first level parity generation circuits, each first level parity generation circuit coupled to a group of columns of memory cells in the memory array to receive data bits from the columns and being adapted to receive a respective hard latch signal, each first level parity generation circuit operable when the corresponding hard latch signal is inactive to develop a corresponding first level parity signal responsive to the data bits from the corresponding group of columns where first level parity signal indicates the parity of the data bits, and each first level parity generation circuit operable when the corresponding hard latch signal is active to drive the corresponding first level parity signal to a set value independent of the corresponding data bits;
   a second level parity generation circuit coupled to the first level parity generation circuits to receive the first level parity signals, the second level parity generation circuit operable to develop an output parity signal responsive to the first level parity signals; and
   a redundancy logic circuit coupled to the first level parity generation circuits and operable to activate selected ones of the hard latch signals as a function of defective and inactive columns of memory cells in the memory array.

19. The electronic system of claim 18 wherein the electronic system comprises a computer system.

20. The electronic system of claim 18 wherein the memory comprises a DRAM.

21. A method of generating parity bits for data words from a memory cell array, the array including a plurality of memory cells arranged in rows and columns, and the method comprising:
   sensing data bits from a row of memory cells in the array;
   generating a plurality of parity bits from the sensed data bits, each parity bit indicating the parity of a respective group of data bits;
   masking selected ones of the parity bits; and
   combining the nonmasked parity bits to generate an overall parity bit.

22. The method of claim 21 wherein generating a plurality of parity bits from the sensed data bits comprises performing an XOR operation on each group of sensed data bits to generate the corresponding parity bit.

23. The method of claim 21 further comprising combining selected ones of the parity bits to generate an overall parity bit for the data word formed by the sensed data bits.

24. The method of claim 21 wherein masking selected ones of the parity bits comprises:
   testing the memory cells in the array to detect defective columns of memory cells;
   setting parity bits generated from groups of data bits including a defective column to selected values; and
   setting parity bits generated from inactive groups of columns of the array to selected values.

25. The method of claim 24 wherein the operations of setting comprise setting the corresponding parity bits to a binary 0.

* * * * *